United States Patent
Calia et al.

[11] 3,962,694
[45] June 8, 1976

[54] METHOD AND APPARATUS FOR MONITORING AN ELECTRICALLY ACTUATED TOOL

[75] Inventors: Vincent S. Calia, Greenlawn; Basil P. Leftheris, Huntington, both of N.Y.

[73] Assignee: Grumman Aerospace Corporation, Bethpage, N.Y.

[22] Filed: Mar. 6, 1975

[21] Appl. No.: 556,169

[52] U.S. Cl. .......................... 340/267 R; 72/DIG. 4; 340/253 A; 340/419
[51] Int. Cl.² ........................................ G08B 21/00
[58] Field of Search ............ 340/267 R, 419, 253 A; 72/DIG. 4, 32, 31

[56] References Cited
UNITED STATES PATENTS

| | | | |
|---|---|---|---|
| 2,681,443 | 6/1954 | Caulk, Jr. ........................... | 340/419 |
| 2,971,808 | 2/1961 | Aller et al. ....................... | 340/267 R |
| 2,978,689 | 4/1961 | Tech et al. ....................... | 340/267 R |
| 3,075,636 | 1/1963 | Manning et al. ....................... | 72/32 |
| 3,419,791 | 12/1968 | Mishkovsky ..................... | 340/253 A |
| 3,555,537 | 1/1971 | Windley ........................... | 340/253 A |
| 3,596,544 | 8/1971 | Pitman ............................. | 340/267 R |
| 3,735,248 | 5/1973 | Reese .............................. | 340/253 A |
| 3,816,816 | 6/1974 | Schweitzer, Jr. ................. | 340/253 A |

*Primary Examiner*—Glen R. Swann, III
*Attorney, Agent, or Firm*—Morgan, Finnegan, Pine, Foley & Lee

[57] ABSTRACT

A method and apparatus for monitoring an electrically actuated tool. The current flowing in the tool circuit is sampled and converted to an analog voltage signal that is proportional to the maximum stress level output of the tool. This converted signal may be displayed and recorded as desired. The converted analog voltage signal is compared with signals representing the current flow that will produce the highest and lowest acceptable stress levels delivered by the tool and a logic control signal is produced if the analog voltage signal is outside the acceptable range. The logic control signal is used to prevent recycling of the tool so that subsequent tool operation is not possible until corrective procedures are instituted. Further, the logic control signal may be used to activate audio and visual indicators. Moreover, the logic control signal can be used to introduce a load into the total circuit to modify the current delivered to the tool and therefore change its output.

14 Claims, 7 Drawing Figures

METHOD AND APPARATUS FOR MONITORING AN ELECTRICALLY ACTUATED TOOL

BACKGROUND OF THE INVENTION

The present invention relates to methods and apparatus for monitoring an electrically actuated tool. More specifically, it relates to a method and apparatus for monitoring the current flow to an electrically actuated tool and ensuring that the tool is operated correctly on each successive run by preventing recycling of the tool in the event that the current flow is outside an acceptable range. The phrase electrically actuated tool is defined broadly to include electrically energized tools for working rivets, interference-fit fasteners, and metal components for welding. Examples of electrically actuated tools which may be used with the present invention are found in U.S. Pat. Nos. 3,646,791; 3,704,506; 3,731,370; 3,824,824; and application Ser. No. 487,747, filed July 11, 1974, entitled "Method And Apparatus For Driving Interference-Fit Fasteners". The present invention may also be utilized with electromagnetic metal forming apparatus, induction heaters, and the like, which are energized by electrical energy. Moreover, the present invention may be utilized with any other tool whose performance depends on the maximum output level of any dynamic variable if the variable is measurable and can be converted to an analog voltage.

Generally, known methods and apparatus for monitoring metal working tools utilize mechanical inspection apparatus, e.g., a hand calibrator. Such manual inspection techniques necessarily delay operation and are often imprecise.

U.S. Pat. No. 3,452,565 (Caldwell) discloses means for controlling the voltage level desired for charging and discharging of a capacitor bank by employing relays and switches. Actuation of the switches opens the charging circuit to terminate charge build-up. Sequentially operated time delayed relays or a multi-cam motor actuator are employed to control charging and discharging to provide continuous operation. Such apparatus is concerned only with establishing a pre-set voltate value at the energy source, and not with monitoring the current flowing in the tool circuit to prevent recycling of the tool when the current flow to the tool is not within an acceptable range.

SUMMARY OF THE INVENTION

It is an object of the present invention to provide a method and apparatus for automatically and continuously monitoring an electrically actuated tool.

It is another object of the present invention to provide a method and apparatus for automatically and continuously monitoring an electrically actuated tool to ensure uniformity and realiability in tool output by comparing the current flowing in the tool circuit with pre-established current reference levels.

It is a further object of the present invention to provide a method and apparatus for monitoring an electrically actuated tool and preventing subsequent use of the tool, when the input current to the tool is outside an acceptable range.

It is a further object of the present invention to provide a method and apparatus for monitoring an electrically actuated tool to modify the current flow delivered to the tool and therefore the output of the tool.

It is a still further object of the present invention to provide a method and apparatus for monitoring an electrically actuated tool which delivers a stress wave to a workpiece.

Briefly, the present invention provides an analog signal that is proportional to the current flowing in the tool circuit. In the case of the electrically actuated tools in the aforementioned patents and application, this is accomplished by measuring the integrated output voltage of a toroidal coil which is placed around the current carrying conductors between the energy source and the tool. The maximum value of the integrated signal, which is proportional to the maximum stress level output of the tool, is then compared to two reference signals that correspond to the highest and lowest acceptable output stress levels for the workpiece. If the maximum value of the integrated signal does not lie in the reference envelope, recycling of the tool is prevented and an error signal is generated which provides the alarm and control features described below. Therefore, the current flow through the tool circuit is continuously monitored to ensure that the current delivered to the tool is within a predetermined current range, so that the desired force output is delivered by the tool.

Advantageously, the current amplitude and time history of the current flowing in the tool circuit may be changed thereby changing the force output of the tool. The present invention permits such changes in current history by introducing a passive or non-passive auxiliary load in parallel with the tool circuit. The auxiliary load is introduced by setting the lower limit reference signal to zero and reducing the upper limit reference signal to an appropriate level. The error signal generated in this case is then used to switch the load into the tool circuit.

BRIEF DESCRIPTION OF THE DRAWING

The present invention is illustrated in the accompanying drawings, in which.

DESCRIPTION OF THE PREFERRED EMBODIMENTS

Figure 1:
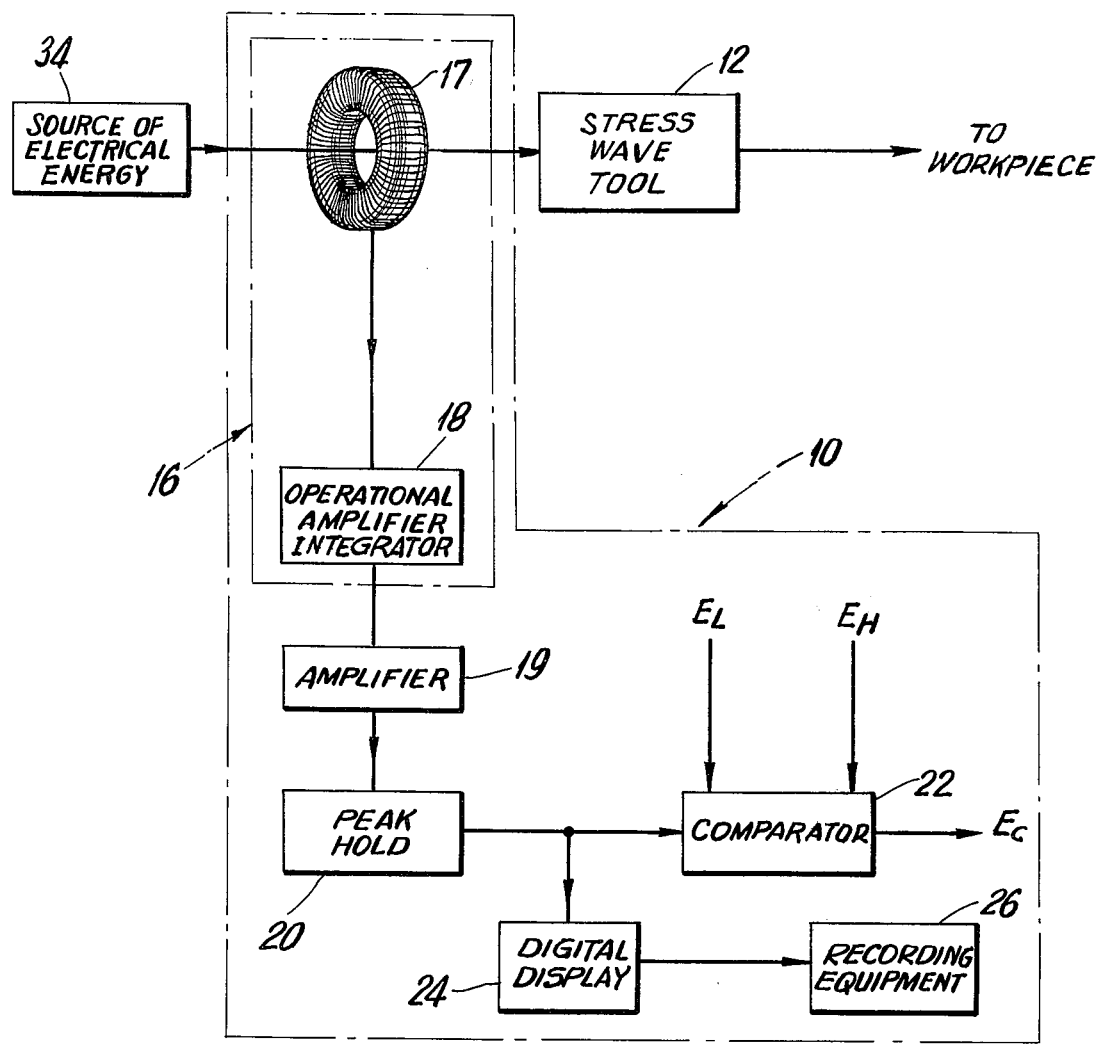
FIG. 1 is a block diagram of a monitoring and display circuit for the present invention.
Figure 3A:
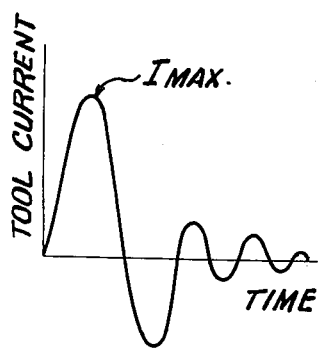
FIGS. 3a–3c show the current waveform undergoing various waveform transitions until it is translated into a voltage signal.
Figure 4:
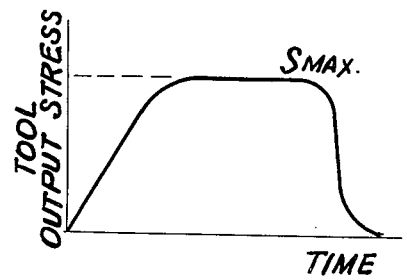
FIG. 4 is a typical stress wave generated by an electrically actuated tool which produces stress waves.

Referring to FIG. 1, the apparatus of the present invention is illustrated at 10 with a stress wave tool 12 which is energized from the stored electrical energy of capacitor bank 34. Normal cycling of the tool, see FIG. 2, starts with fire switch 42 open and manual start charge switch 32 closed. Once energy storage in the capacitor bank 34 is completed, switch 32 opens and switch 42 is closed discharging the stored energy through tool 12. The current waveform in the tool circuit 15 is illustrated in FIG. 3a. The resulting output stress wave produced by the tool 12 is shown in FIG. 4.

The maximum stress level of the output stress wave is proportional to the maximum input current squared, $S_{MAX} \approx I_{MAX}^2$. This relationship between the maximum stress level and maximum or peack current level is utilized to ensure that the resulting metal working, e.g., riveting, is done with the desired force level. Uniformity and reliability in metal working are automatically achieved by comparing the current in the tool circuit 15 with predetermined reference current levels.

The current flowing in the tool circuit 15 which is generally in the form of a damped sinusoidal waveform is sensed by a conventional transducer 16. The transducer 16 includes a toroidal coil 17 which provides a signal proportional to the rate of change of the current delivered to the tool 12 and a conventional integrator 18 in the form of an operational amplifier for integrating the output from the toroidal coil 17. Thus, the output voltage from the transducer 16 is directly proportional to the current delivered to the tool 12.

Figure 3B:
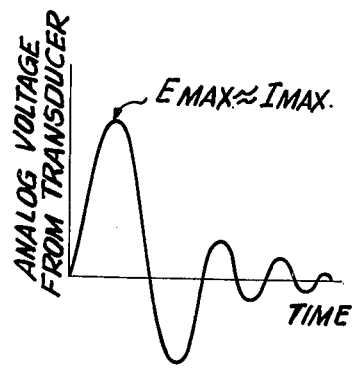
Figure 3C:
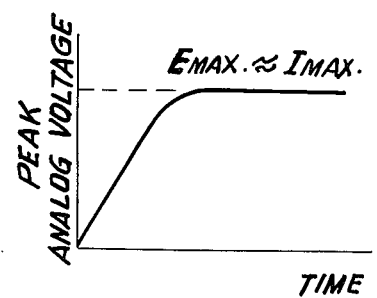

The integrated voltage signal shown in FIG. 3b is amplified at 19 and transmitted to a conventional peak hold circuit 20 where the peak height of the waveform is monitored and held, at its maximum level $E_{MAX}$, see FIG. 3c. The voltage signal $E_{MAX}$ is transmitted to the input of a conventional window comparator 22. Reference voltage signals $E_H$ and $E_L$, proportional to the highest and lowest acceptable stress wave levels are also supplied to the input of the comparator 22. The output from the comparator 22 is zero ($E_C=0$) if $E_L \leq E_{MAX} \leq E_H$. However, if $E_L > E_{MAX}$ or if $E_{MAX} > E_H$ an error signal is generated in the form of a DC voltage ($E_C > 0$). This error signal is utilized to prevent recycling of the tool 12 on subsequent runs by disconnecting the energy source 14 from the energy storage capacitor bank 34 and maintaining and disconnection till manually reset.

Advantageously, the voltage input from the peak hold circuit 20 may also be transmitted to a conventional digital display 24. The Binary Coded Decimal output or the analog output from the digital display 24 may be transmitted to conventional recording equipment 26, which may include a digital computer.

Figure 2:
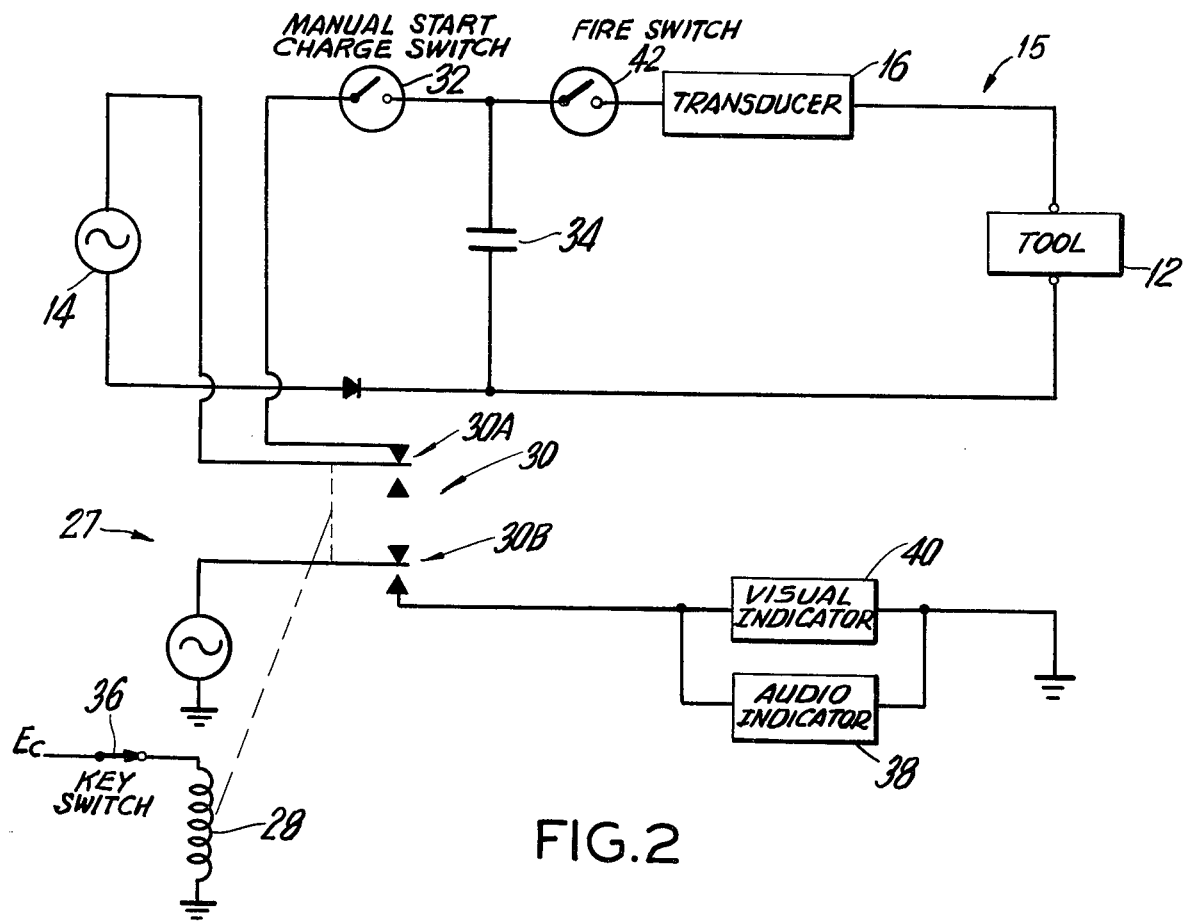
FIG. 2 is a partial schematic and block diagram of the audio and visual indicators, latching relay which are operative in response to an error signal from the comparator of FIG. 1.

With reference to FIG. 2, a circuit 27 is illustrated for utilizing the error signal ($E_C$) for interrupting the normal cycling of the electrical energy from the energy source 14 to energy storage capacitor bank 34. A latching relay 28 is energized by the presence of the error signal $E_C$. Once energized, the latching relay 28 switches and opens DPDT contacts 30 which are normally closed for energizing a capacitor bank 34. One set of contacts 30A opens the circuit to a manual start charge switch 32 inhibiting further cycling of the capacitor bank 34 until the latching relay 28 is de-energized by opening the key lock switch 36. Advantageously, the other set of contacts 30B may be closed to energize audio and visual alarms 38 and 40, respectively.

Figure 5:
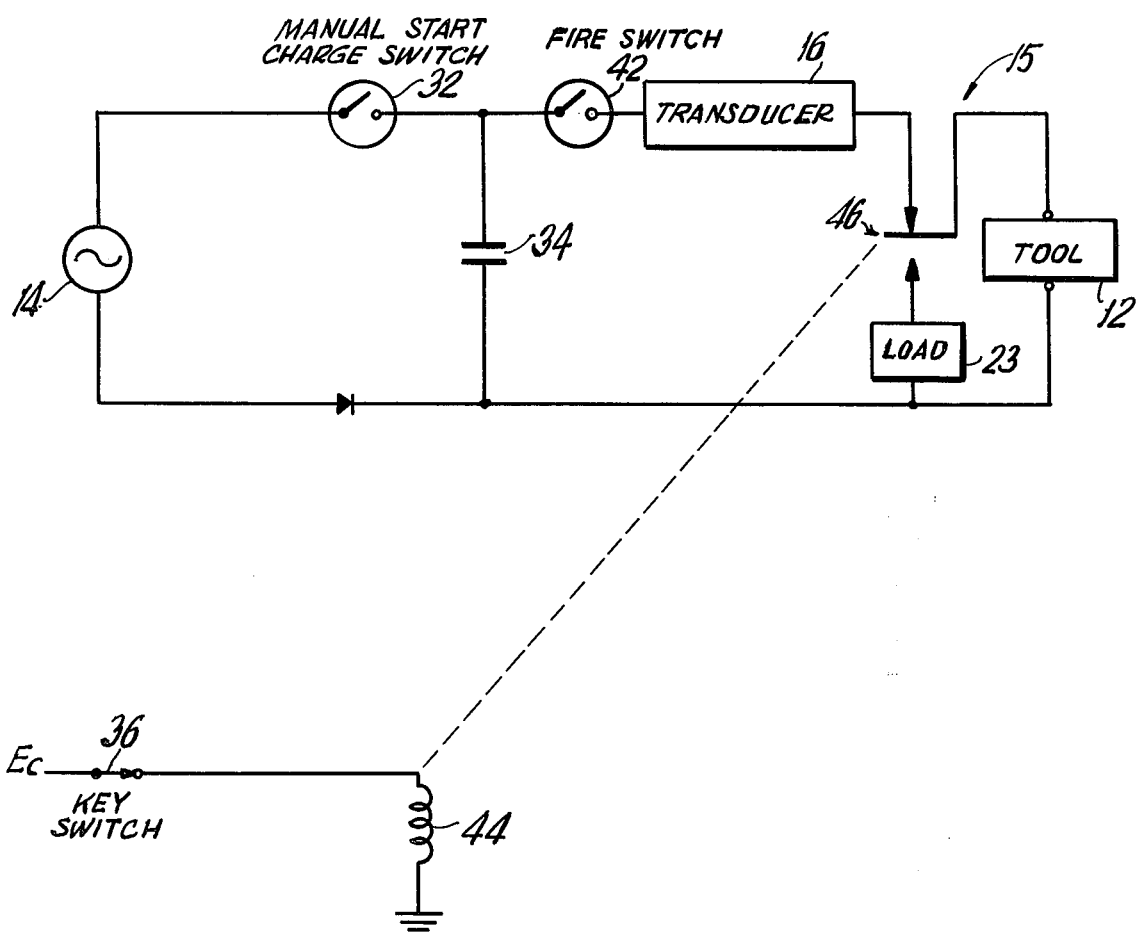
FIG. 5 is a partial schematic and block diagram showing means for introducing an auxiliary load into the tool circuit so that the resulting tuned circuit changes the output of the tool.

Referring to FIG. 5, if the voltage signal of FIG. 3b is above $E_H$ an error signal is generated that may be used to change the current flow from the capacitor bank 34 to the tool 12 by energizing a relay 44. Once energized, the relay switches contacts 46, placing load 23 in the tool circuit 15. The load 23, which may be passive and/or nonpassive electrical elements, and tool 12 provide a tuned circuit which changes the output of the tool 12 by changing the tool current waveform. In this case the reference signal $E_L$ is set at zero and the upper limit reference voltage is set in the range $0 \leq E_H \leq E_{MAX}$, see FIG. 3b, so that the auxiliary electrical load can be switched into the tool circuit at any time during the rise time of the current waveform of FIG. 3a. Return to normal tool operation is accomplished by opening of the key switch 36 which de-energizes the relay 44 causing the contacts 46 to switch the load 23 out of the tool circuit 15.

The present invention continuously monitors the current in the tool circuit 15 to detect a failure in the components thereof, e.g., the capacitor bank, coils of the tool 12, cables, etc. If the resulting voltage input $E_{MAX}$ to the comparator 22 is outside of the envelope or range established by $E_L$ and $E_H$, an error signal, $E_C$, is generated. The error signal energizes relay winding 28 to open normally closed contacts 30A and interrupt the flow of current from the energy source 14 to the capacitor bank 34, preventing further cycling of the tool 12. The audio and visual indicators 38 and 40 are energized simultaneously by the other set of contacts 30B to signal the operator that the tool current is outside of the desired range. To close the contacts 30A and again render the apparatus operative, the key switch 36 is reset. The reset key may be carried by supervisory personnel or by the tool operator, as desired. Moreover, if it is desirable to modify the current waveform from the capacitor bank 34 to the tool 12, an error signal can be generated by manually presetting $E_H$ below $E_{MAX}$ and using the error signal ($E_C$) to switch an auxiliary electrical load 23 into the tool circuit 15.

It should be understood by those skilled in the art that various modifications may be made in the present invention without departing from the spirit and scope thereof as described in the specification and defined in the appended claims.

What is claimed is:

1. A method of monitoring the current flowing in the tool circuit of an electrically actuated tool, in which the force output delivered by the tool is proportional to the square of the current delivered to the tool, comprising the steps of:
   a. providing an analog voltage signal proportional to the rate of change of the current delivered to the tool;
   b. integrating the analog voltage signal resulting from step (a) to provide a voltage signal proportional to the current delivered to the tool;
   c. monitoring the amplitude of the integrated voltage signal resulting from step (b) and holding the maximum value thereof;
   d. comparing the maximum amplitude of the integrated voltage signal with a reference envelope; and
   e. producing an error signal if the maximum amplitude of the integrated voltage signal is outside the range established by the reference envelope.

2. The method claimed in claim 1 including the step of:
   preventing the recycling of the tool when the error signal is present.

3. The method recited in claim 1 including the optional step of:
   introducing a load into the tool circuit when the value held iin tep (c) is above the maximum value of the reference envelope.

4. The method claimed in claim 1 including the step of:
   digitally displaying the maximum amplitude of the integrated voltage signal.

5. The method claimed in claim 4 including the step of:
   recording the displayed digital information.

6. The method as claimed in claim 1 including the step of:
   providing audio and visual indications in response to the presence of the error signal.

7. Apparatus for monitoring the current flowing in the tool circuit of an electrically actuated tool, comprising:
   means for providing an analog voltage signal proportional to the current delivered to the tool;
   means for monitoring the analog voltage signal and holding the maximum amplitude thereof.
   means for comparing the amplitude of the signal held by said monitoring and holding means with reference signals which are proportioned to the highest and lowest allowable force output levels and producing an error signal if the signal held by said monitoring and holding means is outside the range established by the two reference signals; and
   means for preventing recycling of the tool in the presence of an error signal.

8. The apparatus claimed in claim 7, including:
   audio and visual indicator means, said audio and visual indicator means being electrically coupled to said recycling preventing means for actuation in response to an error signal from said comparing means.

9. The apparatus claimed in claim 7, wherein:
   said recycling preventing means includes a latching relay actuated by an error signal from said comparing means, said latching relay including a key-operated reset switch.

10. The apparatus claimed in claim 7, including:
    means for digitally displaying the signal held by said monitoring and holding means;
    means for digitally recording the signal held by said monitoring and holding means.

11. The apparatus claimed in claim 7, wherein:
    said analog voltage signal providing means includes a toroidal coil for sensing the current delivered to the tool.

12. Apparatus for monitoring the current flowing in the tool circuit of an electrically actuated tool in which the force output delivered by the tool is proportional to the square of the current delivered to the tool, comprising:
    means for providing an analog voltage signal proportional to the rate of change of the current delivered to the tool;
    means for integrating the analog voltage signal from said providing means to provide a voltage signal proportional to the current delivered to the tool;
    means for monitoring the amplitude of the integrated voltage signal from said integrating means and holding the maximum value thereof; and
    means for comparing the maximum amplitude of the integrated voltage signal with a reference envelope to produce an error signal if the maximum amplitude of the integrated voltage signal is outside the range established by the reference envelope.

13. The apparatus claimed in claim 12 including:
    means for preventing recycling of the tool when the error signal is present.

14. The apparatus recited in claim 12 including:
    means for introducing an electrical load into the tool circuit when the value held by the monitoring and holding means is above the maximum value of the reference envelope.

* * * * *